United States Patent
Banerjee et al.

(10) Patent No.: US 11,011,657 B2
(45) Date of Patent: May 18, 2021

(54) COLORED SOLAR PANELS AND STRUCTURES COMPRISING THE SAME

(71) Applicants: Toyota Motor Engineering & Manufacturing North America, Inc., Erlanger, KY (US); Toyota Jidosha Kabushiki Kaisha, Toyota (JP)

(72) Inventors: Debasish Banerjee, Ann Arbor, MI (US); Yuki Kudo, Shizoka (JP); Taizo Masuda, Kanagawa (JP)

(73) Assignees: Toyota Motor Engineering & Manufacturing North America, Inc., Plano, TX (US); Toyota Jidosha Kabushiki Kaisha, Toyota (JP)

( * ) Notice: Subject to any disclaimer, the term of this patent is extended or adjusted under 35 U.S.C. 154(b) by 186 days.

(21) Appl. No.: 15/730,035

(22) Filed: Oct. 11, 2017

(65) Prior Publication Data
US 2019/0109248 A1 Apr. 11, 2019

(51) Int. Cl.
| | |
|---|---|
| *H01L 31/048* | (2014.01) |
| *H02S 20/26* | (2014.01) |
| *H01L 31/054* | (2014.01) |
| *H02S 20/30* | (2014.01) |
| *H02S 40/22* | (2014.01) |

(52) U.S. Cl.
CPC .......... *H01L 31/048* (2013.01); *H01L 31/054* (2014.12); *H01L 31/0547* (2014.12); *H02S 20/26* (2014.12); *H02S 20/30* (2014.12); *H02S 40/22* (2014.12); *Y02E 10/52* (2013.01)

(58) Field of Classification Search
CPC ............................................. H01G 9/20–2095
See application file for complete search history.

(56) References Cited

U.S. PATENT DOCUMENTS

| | | | |
|---|---|---|---|
| 2005/0132929 A1* | 6/2005 | Raksha | C09C 1/0051 106/415 |
| 2009/0133739 A1* | 5/2009 | Shiao | H01L 31/048 136/251 |
| 2010/0175587 A1* | 7/2010 | Rueger | C09C 1/0069 106/403 |

(Continued)

FOREIGN PATENT DOCUMENTS

| | | |
|---|---|---|
| CN | 202487586 U | 10/2012 |
| JP | 2012060048 A | 3/2012 |

(Continued)

*Primary Examiner* — Eric R Smith
(74) *Attorney, Agent, or Firm* — Dinsmore & Shohl (57) ABSTRACT

A colored solar module includes a light incident side, a backside, and a photovoltaic cell positioned between the light incident side and the backside. A color layer extends across the light incident side of the colored solar module. The color layer includes a clear paint and a plurality of opaque reflecting pigments disposed within the clear paint. The composition of the opaque reflecting pigments in the color layer is between about 0.25 weight percent (wt %) and about 5.0 wt % and a comparative solar cell efficiencyof the colored solar module is equal to or greater than 70 %. A color difference between a first portion of the color layer positioned directly over the photovoltaic cell and a second portion of the color layer not positioned directly over the photovoltaic cell as measured in CIELAB color space is less than about 5.0.

18 Claims, 8 Drawing Sheets

(56) References Cited

U.S. PATENT DOCUMENTS

| | | | |
|---|---|---|---|
| 2011/0036390 A1* | 2/2011 | Nelson | B32B 17/10614 136/251 |
| 2011/0134515 A1* | 6/2011 | Banerjee | G02B 5/281 359/359 |
| 2014/0283912 A1* | 9/2014 | Suzuki | C09D 5/004 136/259 |
| 2014/0345684 A1 | 11/2014 | Kuo et al. | |
| 2014/0360575 A1 | 12/2014 | Lin et al. | |
| 2015/0207001 A1 | 7/2015 | Lin et al. | |
| 2016/0049904 A1* | 2/2016 | Sasaki | H01G 9/2068 136/251 |

FOREIGN PATENT DOCUMENTS

| | | |
|---|---|---|
| WO | 2016095977 A1 | 6/2016 |
| WO | 2017090056 A1 | 6/2017 |

\* cited by examiner

COLORED SOLAR PANELS AND STRUCTURES COMPRISING THE SAME

TECHNICAL FIELD

The present specification generally relates to solar panels and, more specifically, to colored solar panels for vehicle body panels.

BACKGROUND

Solar panels for converting solar radiation into electrical energy are known. Such solar panels include a plurality of photovoltaic cells formed from monocrystalline or polycrystalline silicon and have a dark black or blue color depending on which silicon material is used. The use of solar panels on vehicles, buildings, etc., to generate electrical energy has been considered, however the dark black or blue color of the solar panels has limited their acceptance by consumers.

Accordingly, a need exists for alternative solar panels that exhibit the same color as adjacent body panels.

SUMMARY

In one embodiment, a colored solar module includes a light incident side, a backside and a photovoltaic cell positioned between the light incident side and the backside. A color layer extends across the light incident side of the colored solar module. The color layer includes a clear paint layer and a plurality of opaque omnidirectional structural color (OSC) reflecting pigments disposed in the clear paint layer. The concentration of the OSC reflecting pigments in the color layer is between about 0.25 wt % and 5.0 wt % and the colored solar module has a comparative solar cell efficiency equal to or greater than 70%. Also, a color difference between a first portion of the color layer positioned directly over the photovoltaic cell and a second portion of the color layer not positioned directly over the photovoltaic cell is less than about 5.0 as measured in CIELAB color space. In some embodiments, the concentration of the OSC reflecting pigments in the color layer is between about 0.5 wt % and about 2.5 wt % and the colored solar module has a greater than 80%. Also, the plurality of opaque OSC reflecting pigments may reflect a color with a chroma equal to or greater than 30 as measured in CIELAB color space. The color layer may be in direct contact with the light incident side of the colored solar module and a transparent layer may extend across a light incident side of the color layer. In the alternative, a transparent layer may be disposed between the light incident side and the color layer.

In another embodiment, a colored solar module includes an encapsulant, a light incident side, a backside, and a plurality of photovoltaic cells disposed within the encapsulant between the light incident side and the backside. A color layer extending across the light incident side of the colored solar module and the color layer includes a clear paint layer and a plurality of opaque reflecting pigments disposed in the clear paint layer. A concentration of the plurality of opaque reflecting pigments in the color layer is between about 0.25 wt % and about 5.0 wt % and the plurality of opaque reflecting pigments reflect a color with a chroma equal to or greater than 60 as measured in CIELAB color space. Also, comparative solar cell efficiency of each of the colored solar module is equal to or greater than 70%. A color difference between a first portion of the color layer positioned directly over the plurality of photovoltaic cells and a second portion of the color layer not positioned directly over the plurality of photovoltaic cells is less than about 5.0 as measured in CIELAB color space. In embodiments, the plurality of opaque reflecting pigments are plurality of opaque omnidirectional structural color reflecting pigments that reflect a color with a chroma equal to or greater than 50 as measured in CIELAB color space. In some embodiments, the plurality of opaque OSC reflecting pigments reflect a color with a chroma equal to or greater than 60 as measured in CIELAB color space, for example a chroma equal to or greater than 70. The color layer may be in direct contact with the light incident side of each of the colored solar modules and the transparent layer may extend across an outer surface of the color layer. In the alternative, the transparent layer may be disposed between the light incident side of each of the colored solar modules and the color layer.

In still another embodiment, a structure with a colored solar module includes a panel and a colored solar module positioned adjacent to the panel. The colored solar module includes a photovoltaic cell disposed within an encapsulant between a light incident side and a backside of the encapsulant, and a color layer extending across the light incident side of the encapsulant. The color layer includes a clear paint layer and a plurality of opaque reflecting pigments disposed in the clear paint layer. A concentration of the plurality of opaque reflecting pigments in the color layer is between about 0.25 wt % and about 5.0 wt % and the plurality of opaque reflecting pigments reflect a color with a chroma greater than 60 as measured in CIELAB color space. A color difference between the panel and the colored solar module as measured in CIELAB color space is less than about 5.0 and a comparative solar cell efficiency of the colored solar module is equal to or greater than 70%. In embodiments, the solar panel includes a transparent layer extending across an outer surface of the color layer. In such embodiments, an adhesive layer may be disposed between the color layer and the transparent layer. In other embodiments, the solar panel includes a transparent layer disposed between the light incident side of the each a solar cell and the color layer.

These and additional features provided by the embodiments described herein will be more fully understood in view of the following detailed description in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

According to one or more embodiments described herein, a colored solar panel may generally comprise a color layer extending across a light incident side of a solar panel and a photovoltaic cell disposed below the color layer. The color layers described herein may utilize opaque pigments, e.g., opaque omnidirectional structural color (OSC) reflecting pigments that reflect a color with high chroma (also referred to herein as a "high chroma color"). The high chroma color provided by the pigments allow a desired color for the color layer to be obtained with a relatively low concentration of the pigments disposed within the color layer. The relatively low concentration of the pigments within the color layer also allows sufficient solar radiation to pass through the color layer and be incident on the photovoltaic cells such that the colored solar panel with the desired color has a comparative solar cell efficiency equal to or greater than 70%. Accordingly, colored solar panels with acceptable solar cell efficiencies are provided.

The colored solar panels described herein may be disposed on walls, surfaces, etc., of structures such as buildings, vehicles and the like. Non-limiting examples include exterior surfaces of office buildings, industrial buildings, sports stadiums, and vehicle body panels. Non-limiting examples of vehicle body panels include vehicle hood panels, vehicle roof panels, vehicle door panels, vehicle quarter panels, and the like. Utilization of the colored solar panels allows solar panels to be included as part of such structures and convert solar radiation into electrical energy. Various embodiments of colored solar panels and methods for using the same will be described in further detail herein with specific reference to the appended drawings.

Figure 1:
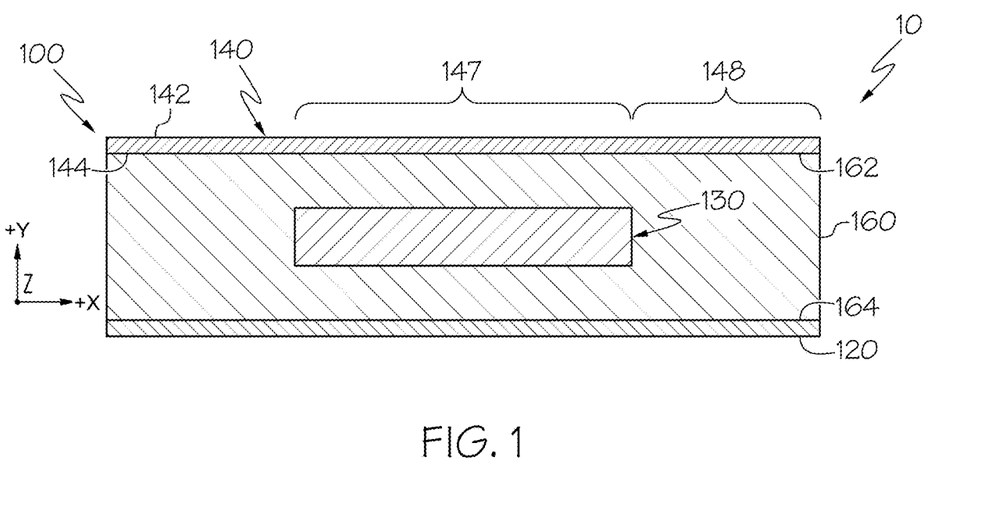
FIG. 1 schematically depicts a cross sectional view of a solar module with a color layer according to one or more embodiments disclosed and described herein.

FIG. 1 generally depicts one embodiment of a colored solar module. The colored solar module includes a light incident side, a backside, and a photovoltaic cell disposed within an encapsulant between the light incident side and the backside. A color layer extends across the light incident side of the colored solar module such that a colored solar module has a desired color when viewed by an observer. As used herein, the term "desired color" refers to a color of a colored solar module not being visibly different from a color of an adjacent panel without a solar module (also referred to herein as "color difference") when viewed by an observer. Examples of adjacent panels without a solar module include painted building walls and vehicle body panels formed from sheet metal, fiberglass, polymers or the like.

The color layer includes a plurality of opaque reflecting pigments, e.g., opaque OSC reflecting pigments that may reflect a color with a high chroma. That is, the color layer obtains or provides its "color" from the opaque reflecting pigments. As used herein, the term "chroma" refers to the purity or intensity of a color and the term "high chroma" as used herein refers to a chroma of a color that is equal to or greater than 60 as measured in Commission internationale de l'éclairage L*a*b* (CIELAB) color space described in greater detail below. Accordingly, in embodiments, the color layer includes a plurality of opaque reflecting pigments, e.g., opaque OSC reflecting pigments that reflect a color with a chroma equal to or greater than 60. In other embodiments, the color layer includes a plurality of opaque reflecting pigments, e.g., opaque OSC reflecting pigments, that reflect a color with a chroma less than or equal to 60. For example, the color layer may include a plurality of opaque reflecting pigments, e.g., opaque OSC reflecting pigments, that reflect a color with a chroma equal to or greater than 30, equal to or greater than 40, equal to or greater than 50, equal to or greater than 60, equal to or greater than 70, equal to or greater than 80, equal to or greater than 90, equal to or greater than 100, and less than or equal to 110, less than or equal to 100, less than or equal to 90, less than or equal to 80, less than or equal to 70, less than or equal to 60, less than or equal to 50, or less than or equal to 40. Colors with a high chroma reflected by the opaque reflecting pigments provide the color layer with a desired color using a relatively low concentration of the opaque reflecting pigments within the color layer. As used herein, the term "relatively low concentration" refers to less than or equal to 10 percent by weight (i.e., ≤10 wt %), e.g., less than or equal to 5 wt %, of the overall composition of the color layer. Also, the relatively low concentration of the opaque reflecting pigments allows sufficient solar radiation to pass through the color layer and be incident on the photovoltaic cell such that a comparative solar cell efficiency of the colored solar module, compared to a non-colored solar module, is equal to or greater than 60%. For example, in embodiments the comparative solar cell efficiency of the colored solar module is equal to or greater than 70%. In such embodiments, the comparative solar cell efficiency of the colored solar module may be equal to or greater than 80%.

Still referring to FIG. 1, embodiments of a colored solar module 10 include a light incident side 162, a backside 164, and a photovoltaic cell 130 disposed within an encapsulant 160 between the light incident side 162 and the backside 164. As used herein, the term "light incident side" refers to a surface of a layer of the colored solar module 10 upon which solar radiation propagating to the photovoltaic cell 130 is first incident on. That is, a light incident side of a layer of the colored solar module 10 is a surface that faces the sun when the colored solar module 10 is oriented to receive solar radiation and generate electricity from solar radiation incident on the photovoltaic cell 130. The term "backside" refers to a surface of a layer of the colored solar module 10 spaced apart from the light incident side. A back sheet 120 may extend across the backside 164 and a color layer 140 extends across the light incident side 162. The color layer 140 includes a first portion 147 positioned directly above (+Y direction) the photovoltaic cell 130 and a second portion 148 not positioned directly above the photovoltaic cell 130. Also, the color layer 140, and the colored solar module 10, have a desired color when viewed by an observer in the −Y direction depicted in the figures.

Figure 2:
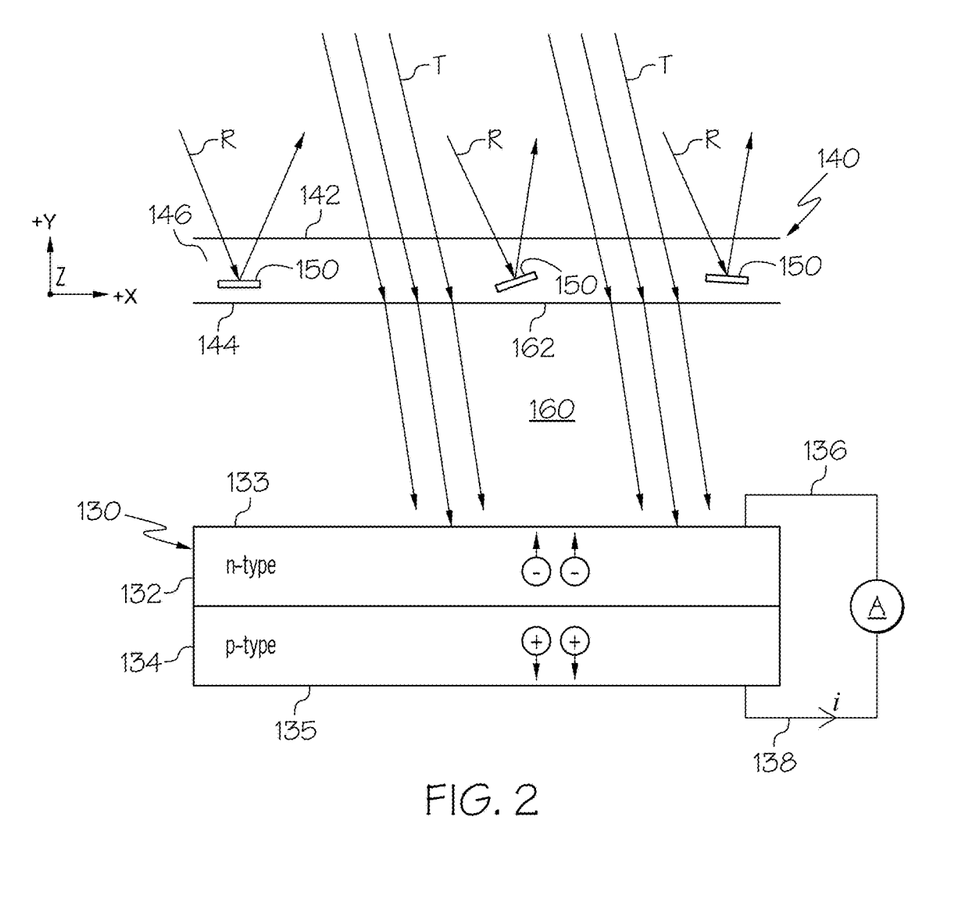
FIG. 2 schematically depicts an enlarged view of the color layer in FIG. 1.

Referring to FIG. 2, an enlarged view of the color layer 140 and the photovoltaic cell 130 encapsulated within the encapsulant 160 is depicted. The color layer 140 may include a clear paint layer 146 with a light incident side 142 and a backside 144. As used herein, the term "clear paint layer" refers to transparent paint layer. Disposed within the clear paint layer 146 is a plurality of opaque reflecting pigments 150. In embodiments, the opaque reflecting pigments are opaque OSC reflecting pigments. As used herein, the term "opaque OSC reflecting pigment" or "opaque OSC reflecting pigments" refers to pigments that are opaque and exhibit a change in color when viewed from different angles (e.g., 0° and 45°) that is not perceptible to the unaided human eye. That is, when the surface of an opaque OSC reflecting pigment is viewed from different angles (e.g., 0° and 45°), the opaque OSC reflecting pigment does not appear to change color to an observer. Accordingly, the color layer 140 with the opaque OSC reflecting pigments 150 disposed within the clear paint layer 146 does not appear to change color to an observer when the light incident side 142 of the color layer 140 is viewed from different angles (e.g., 0° and 45°). The concentration of the opaque reflecting pigments 150, and other pigments described herein, disposed in the clear paint layer may be equal to or less than 5.0 wt %, 4.8 wt %, 4.6 wt %, 4.4 wt %, 4.2 wt %, 4.0 wt %, 3.8 wt %, 3.6 wt %, 3.4 wt %, 3.2 wt %, 3.0 wt %, 2.8 wt %, 2.6 wt %, 2.4 wt %, 2.2 wt %, 2.0 wt %, 1.8 wt %, 1.6 wt %, 1.4 wt %, 1.2 wt %, 1.0 wt %, 0.8 wt %, or 0.6 wt %, and greater than or equal to 0.2 wt %, 0.4 wt %, 0.6 wt %, 0.8 wt %, 1.0 wt %, 1.2 wt %, 1.4 wt %, 1.8 wt %, 1.8 wt %, 2.0 wt %, 2.2 wt % or 2.4 wt %. In embodiments, the concentration of the opaque reflecting pigments 150 disposed in the clear paint layer 146 may be between about 0.4 wt % and about 2.4 wt %. In some embodiments, the concentration of the opaque reflecting pigments 150 disposed in the clear paint layer 146 may be between about 0.4 wt % and about 1.0 wt %. In other embodiments, the concentration of the opaque reflecting pigments 150 disposed in the clear paint layer 146 may be between about 1.0 wt % and about 2.0 wt %. In still other embodiments, the concentration of the opaque reflecting pigments 150 disposed in the clear paint layer 146 may be between about 0.6 wt % and about 1.4 wt %.

In embodiments, the back sheet 120 may be formed from polymeric materials. Non-limiting examples of materials used to form the back sheet 120 include ethylene vinyl acetate (EVA), polyethylene terephthalate (PET), polyvinyl fluoride (PVF), ethylene propylene diene monomer (EPDM) based polymers, and combinations thereof. The clear paint layer 146 may be a urethane clear paint layer, an acrylic clear paint layer, or the like. The encapsulant 160 may be formed from a thermoplastic such as a vinyl polymer that protects the photovoltaic cell from moisture, dirt, ice, etc., during use of the solar cell. In embodiments, the encapsulant 160 is formed from polyvinyl acetate (PVA). Also, the encapsulant 160 may include features to enhance collection of light within the encapsulant 160. Non-limiting features to enhance the collection of light include roughened glass surfaces, diffractive elements, prism arrays, air prisms, v-grooves, diffuse elements, multi-directional waveguide arrays and/or active coatings that convert infrared light into visible light.

As schematically depicted in FIG. 2, a first portion of light incident on the color layer 140 is reflected by the opaque reflecting pigments 150 (shown as arrows 'R') and a second portion of light is not reflected and is transmitted through the color layer 140 (shown as arrows 'T') into the encapsulant 160. Light T transmitted through the color layer 140 may be incident on the photovoltaic cell 130. The photovoltaic cell 130 includes an n-type layer 132 with a light incident side 133 and a p-type layer 134 with a backside 135. A first electrical lead 136 is in electrical communication with the light incident side 133 of the n-type layer 132 and a second electrical lead 138 is in electrical connection with the backside 135 of the p-type layer 134. Light T incident on the light incident side 133 of the n-type layer 132 dislodges electrons in the n-type layer thereby creating free electrons and positive holes. The free electrons flow through the first electrical lead 136 and the second electrical lead 138 to the backside 135 of the p-type layer 134 to provide a current 'i' flowing from the photovoltaic cell 130.

The relatively low concentration of the opaque reflecting pigments 150 within the color layer 140 allows sufficient light T to pass through the clear paint layer 146 and be incident on the photovoltaic cell 130 such that the colored solar module 10 has a comparative solar cell efficiency equal to or greater than 60%, 65%, 70%, 75%, 80%, 85%, or 90%, and less than or equal to 99%, 95%, 90%, 85%, 80%, 75%, or 70%. As used herein, the term "comparative solar cell efficiency" refers to the amount of energy provided by a solar module with a color layer (colored solar module) compared to a solar module without a color layer. That is, the comparative solar cell efficiency (CSCE %) of a colored solar module is given by the expression:

$$\text{CSCE } (\%) = E_{CSM}/E_{ref} \times 100 \qquad (1)$$

where $E_{CSM}$ is the energy provided by the colored solar module and $E_{ref}$ is the energy provided by the solar module without a color layer. In embodiments, the colored solar module 10 has a comparative solar cell efficiency equal to or greater than 60%, for example equal to or greater than 70%, or equal to or greater than 80%. In some embodiments, the relatively low concentration of the opaque reflecting pigments 150 within the color layer 140 allows sufficient light T to pass through the clear paint layer 146 and be incident on the photovoltaic cell 130 such that the colored solar module 10 has a comparative solar cell efficiency between about 75% and about 85%. In such embodiments, the colored solar module 10 may have a comparative solar cell efficiency between about 78% and about 82%. Also, the high chroma (intensity) color reflected by the opaque reflecting pigments 150 results in the relatively low concentration of opaque reflecting pigments 150 providing the color layer 140 with a desired color. Accordingly, the colored solar module has a desired color for use as a vehicle body panel or to be included as part of a vehicle body panel.

As depicted in FIG. 2, the opaque reflecting pigments 150 may be oriented at different angles relative to the light incident side 162 of the encapsulant 160 and the light incident side 142 of the clear paint layer 146. In embodiments where the opaque reflecting pigments 150 are opaque OSC reflecting pigments 150, the omnidirectional properties of the opaque OSC reflecting pigments 150 result in the color layer 140 having or exhibiting a non-shifting color when viewed from different angles by an observer as described in more detail below.

Figure 3:
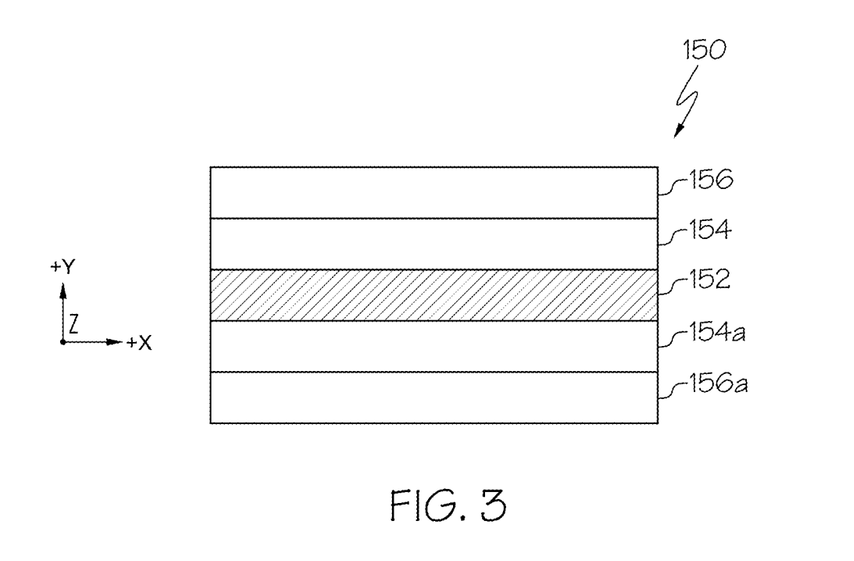
FIG. 3 schematically depicts a side view of an opaque omnidirectional structural color reflecting pigments according to one or more embodiments disclosed and described herein.

Referring now to FIG. 3, embodiments of an opaque OSC reflecting pigment 150 are depicted. The opaque OSC reflecting pigment 150 may include a core layer 152, also referred to as a reflecting layer 152, a first layer 154 extending across the reflecting layer 152, and a second layer 156 extending across the first layer 154. In embodiments, the first layer 154 is in direct contact with the reflecting layer 152 and the second layer 156 is in direct contact with the first layer 154. As depicted in FIG. 3, in some embodiments the opaque OSC reflecting pigments 150 are formed with the reflecting layer 152 positioned between a pair of first layers 154, 154a, and the reflecting layer 152 and the pair of first layers 154, 154a positioned between a pair of second layers 156, 156a. That is, the first layer 154 extends across an upper surface (+Y direction) of the reflecting layer 152 and an oppositely disposed first layer 154a extends across a bottom surface (−Y direction) of the reflecting layer 152. Also, the second layer 156 extends across an outer surface (+Y direction) of the first layer 154 and an oppositely disposed second layer 156a extends across an outer surface (−Y direction) of the first layer 154a.

Non-limiting examples of materials used to form the reflecting layer 152 include aluminum (Al), silver (Ag), chromium (Cr), and alloys thereof. As used herein, the term "alloys thereof" does not limit alloys formed from only the elements listed unless stated otherwise. For example, the reflecting layer 152 may be formed from Al, Ag, Cr, alloys of Al containing elements other than Ag and Cr, or alloys of Al containing elements in addition to Ag and/or Cr, etc. In the alternative, the reflecting layer 152 may be formed Al alloys containing only Al, Ag and/or Cr, and incidental impurities present from the manufacture of the Al alloy. It should be understood that the reflecting layer 152, and other reflecting layers described herein, prevent or block light from passing through the opaque OSC reflecting pigment 150, i.e. the reflecting layers render the OSC reflecting pigments "opaque."

In embodiments, the first layers 154, 154a are dielectric layers, and the second layers 156, 156a are absorber layers. In other embodiments, the first layers 154, 154a are absorber layers and the second layers 156, 156a are dielectric layers. Non-limiting examples of materials used to form the dielectric layers include zinc sulfide (ZnS), magnesium fluoride ($MgF_2$) and titanium oxide ($TiO_2$). Non-limiting examples of materials used to form the absorber layers include chromium (Cr) germanium (Ge), nickel (Ni), stainless steel, palladium (Pd), titanium (Ti), silicon (Si), vanadium (V), cobalt (Co), tungsten (W), molybdenum (Mo), niobium (Nb), and alloys thereof.

The first layer 154 may be formed from the same material as the first layer 154a and/or the second layer 156 may be formed from the same material as the second layer 156a. In the alternative, the first layer 154 is not formed from the same material as the first layer 154a and/or the second layer 156 is not formed from the same material as the second layer 156a. The thickness of the first layer 154 may be the same as the thickness of the first layer 154a and/or a thickness of the second layer 156 may be the same as the thickness of the second layer 156a. In the alternative, the thickness of the first layer 154 is not the same as the thickness of the first layer 154a and/or the thickness of the second layer 156 is not the same as the thickness of the second layer 156a. In embodiments, the reflecting layer 152 has a thickness between about 50 nanometers (nm) and about 200 nm, the first layers 154, 154a and second layers 156, 156a in the form of dielectric layers each have a thickness between about 0.1 quarter wave (QW) and about 4.0 QW of a control wavelength, and the first layers 154, 154a and second layers 156, 156a in the form of absorber layers each have a thickness between about 5 nm and about 20 nm. As used herein, the term "quarter wave" or "quarter wave of a control wavelength" refers to a thickness equal to one quarter (¼) of a center wavelength of a band of visible light reflected by an opaque OSC reflecting pigment. That is, the control wavelength is equivalent to the center wavelength of a narrow band of reflected visible light provided by the opaque OSC reflecting pigments 150 and other opaque OSC reflecting pigments disclosed herein.

Figure 4:
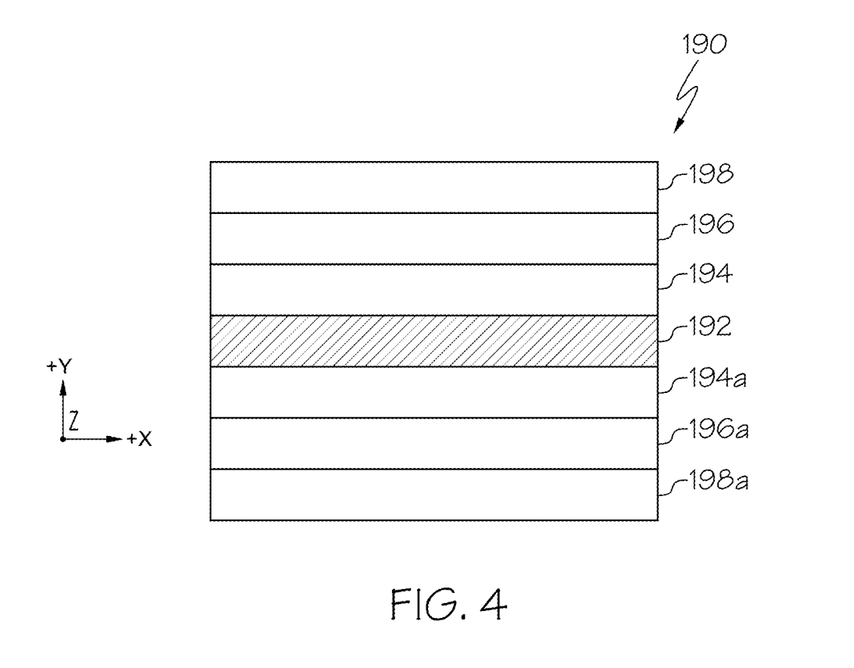
FIG. 4 schematically depicts a side view of an opaque omnidirectional structural color reflecting pigments according to one or more embodiments disclosed and described herein.

While FIG. 3 depicts a five-layer opaque OSC reflecting pigment, it should be understood that opaque OSC reflecting pigments with less than five layers or more than five layers may be disposed within the clear paint layer 146 and provide the color layer 140 with a desired color. For example, embodiments of a seven-layer opaque OSC reflecting pigment 190 are depicted in FIG. 4. The opaque OSC reflecting pigment 190 may include a reflecting layer 192, a first layer 194 extending across the reflecting layer 192, a second layer 196 extending across the first layer 194, and a third layer 198 extending across the second layer 196. In embodiments, the first layer 194 is in direct contact with the reflecting layer 192, the second layer 196 is in direct contact with the first layer 194, and the third layer is in direct contact with the second layer 196. In some embodiments the opaque OSC reflecting pigments 190 are formed with the reflecting layer 192 positioned between a pair of first layers 194, 194a, the reflecting layer 192 and the pair of first layers 194, 194a positioned between a pair of second layers 196, 196a, and the reflecting layer 192, the pair of first layers 194, 194a and the pair of second layers 196, 196a positioned between a pair of third layers 198, 198a. That is, the first layer 194 extends across an upper surface (+Y direction) of the reflecting layer 192 and an oppositely disposed first layer 194a extends across a bottom surface (−Y direction) of the reflecting layer 192; the second layer 196 extends across an outer surface (+Y direction) of the first layer 194 and an oppositely disposed second layer 196a extends across an outer surface (−Y direction) of the first layer 194a; and the third layer 198 extends across an outer surface (+Y direction) of the second layer 196 and an oppositely disposed third layer 198a extends across an outer surface (−Y direction) of the second layer 196a.

Non-limiting examples of the reflecting layer 192 include layers formed from Al, Ag, Cr, and alloys thereof. In embodiments, the first layers 194, 194a are dielectric layers, the second layers 196, 196a are absorber layers and the third layers 198, 198a are dielectric layers. In other embodiments, the first layers 194, 194a are selective absorber layers, the second layers 196, 196a are absorber layers and the third layers 198, 198a are dielectric layers. In still other embodiments, the first layers 194, 194a are dielectric layers, the second layers 196, 196a are absorber layers and the third layers 198, 198a are selective absorber layers. As used herein, the term "selective absorber layer" refers to a layer that absorbs a first range of visible light more than a second range of visible light, e.g., a selective absorber layer may absorb red light more than blue light, blue light more than red light, etc. Non-limiting examples of materials used to form the reflecting layer include Al, Ag, Cr, and alloys thereof. Non-limiting examples of materials used to form the dielectric layers include ZnS, $MgF_2$, and $TiO_2$, and non-limiting examples of materials used to form selective absorber layers include layers formed from $Fe_2O_3$, TiN, copper, and brass. Non-limiting examples of materials used to form absorber layers include Cr, Ge, Ni, stainless steel, Pd, Ti, Si, V, Co, W, Mo, Nb, and alloys thereof.

The first layer 194 may be formed from the same material as the first layer 194a, the second layer 196 may be formed from the same material as the second layer 196a, and/or the third layer 198 may be formed from the same material as the third layer 198a. In the alternative, the first layer 194 is not formed from the same material as the first layer 194a, the second layer 196 is not formed from the same material as the second layer 196a, and/or the third layer 198 is not formed from the same material as the third layer 198a. Also, the thickness of the first layer 194 may be the same as the thickness of the first layer 194a, the thickness of the second layer 196 may be the same as the thickness of the second layer 196a, and/or the thickness of the third layer 198 may be the same as the thickness of the third layer 198a. In the alternative, the thickness of the first layer 194 is not the same as the thickness of the first layer 194a, the thickness of the second layer 196 is not the same as the thickness of the second layer 196a, and/or the thickness of the third layer 198 is not the same as the thickness of the third layer 198a. In embodiments, the reflecting layer 192 has a thickness between about 50 nanometers (nm) and about 200 nm. The first layers 194, 194a and the third layers 198, 198a in the form of dielectric layers each have a thickness between about 0.1 QW and about 4.0 QW; the first layers 194, 194a and the third layers 198, 198a in the form of selective absorber layers each have a thickness between about 5 nm and about 500 nm; and the second layers 196, 196a in the form of absorber layers each have a thickness between about 5 nm and about 20 nm.

Figure 5:
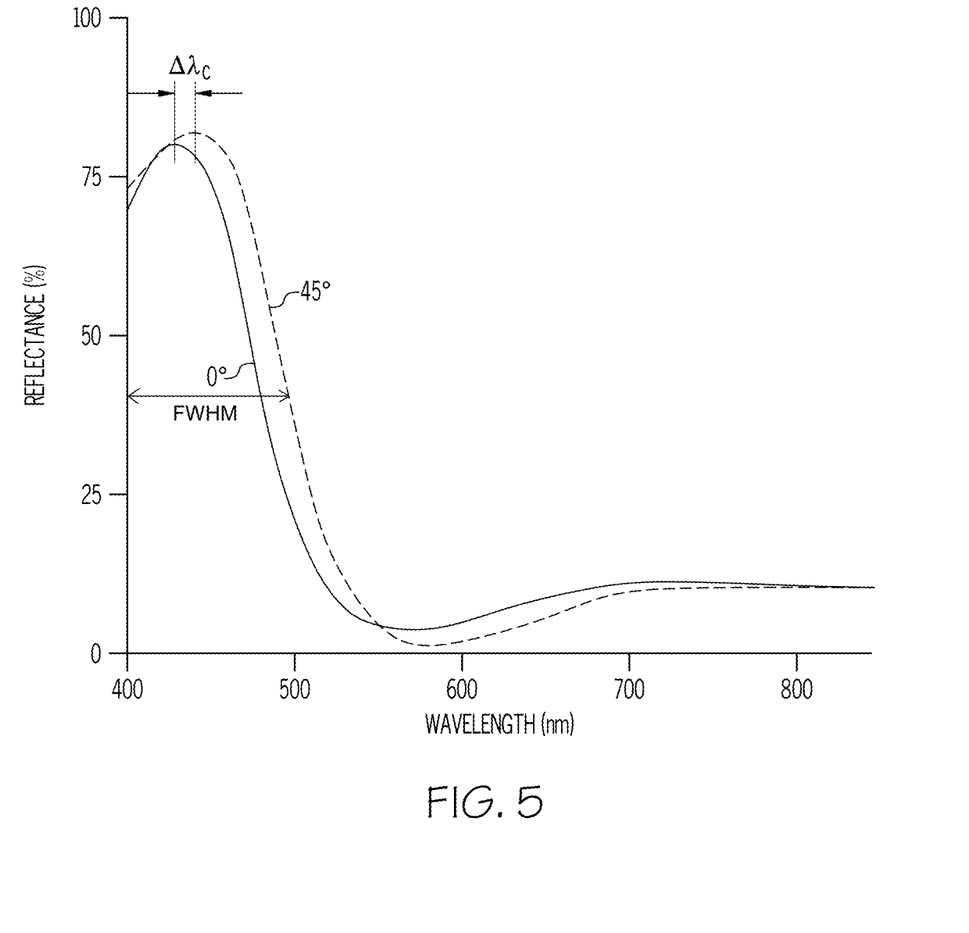
FIG. 5 graphically depicts reflectance spectra for an opaque omnidirectional structural color reflecting pigments according to one or more embodiments disclosed and described herein.

As mentioned above the opaque OSC reflecting pigments described herein exhibit a non-shifting color when viewed from different angles by an observer. One measure of the non-shifting color for an opaque OSC reflecting pigment is the shift or movement of a reflectance spectrum from the opaque OSC reflecting pigment when viewed at different angles. Particularly, two reflectance spectra for an opaque OSC reflecting pigment 190 illuminated with white light and viewed at 0° (normal to the outer surface) and 45° is depicted in FIG. 5. The opaque OSC reflecting pigment 190 had a reflecting layer 192 formed from Al with a thickness of 50 nm, first layers 194, 194a formed from ZnS (dielectric layers) with a thickness of 72 nm, second layers 196, 196a formed from Cr (absorber layers) with a thickness of 15 nm, and third layers 198, 198a formed from ZnS (dielectric layers) with a thickness of 70 nm. The reflectance spectrum for the opaque OSC reflecting pigment 190 when viewed at 0° has a full width of visible light measured at half the maximum reflectance intensity (FWHM) of about 75 nm and a center wavelength of about 430 nm. The reflectance spectrum for the opaque OSC reflecting pigment 190 when viewed at 45° has a FWHM of about 100 nm and a center wavelength of about 445 nm. Accordingly, the opaque OSC reflecting pigment 190 reflects a narrow band of visible light (<200 nm) with a shift of the center wavelength (also referred to herein as "color shift") less than or equal to 15 nm when viewed at angles between 0° and 45° which is not detectable to the unaided human eye when viewing the outer surface of the opaque OSC reflecting pigment 190. It should be understood that a color shift not detectable to the unaided human eye depends on the color (hue) and its intensity (chroma) being viewed by an observer. Also, in embodiments, the opaque OSC reflecting pigments described herein may have a center wavelength shift of less than 50 nm, for example less than 40 nm, less than 30 nm, less than 20 nm or less than 15 nm, all of which are not detectable to the unaided human eye for the hue and chroma (color) reflected by a given opaque OSC reflecting pigment.

While 5-layer opaque OSC reflecting pigments 150 and 7-layer opaque OSC reflecting pigments 190 comprising dielectric layers, absorber layers and selective absorber layers are described above, other opaque OSC reflecting pigments may be disposed in the color layer 140 and provide a desired color at a relatively low concentration. Non-limiting examples of opaque OSC reflecting pigments that may be disposed in the color layer 140 include pigments described in U.S. patent application Ser. Nos. 11/837,529; 12/388,395; 12/467,656; 12/793,772; 12/893,152; 12/974,606; 13/014,398; 13/021,730; 13/572,071; 13/760,699; 13/913,402; 14/138,499; 14/242,429; 14/460,511; 14/471,834; 14/607,933; 14/793,117; 14/793,123; 14/793,133; and 15/144,283. Also, opaque reflecting pigments formed from a single layer, e.g., a single layer of aluminum, may be disposed in the color layer 140.

Figure 6:
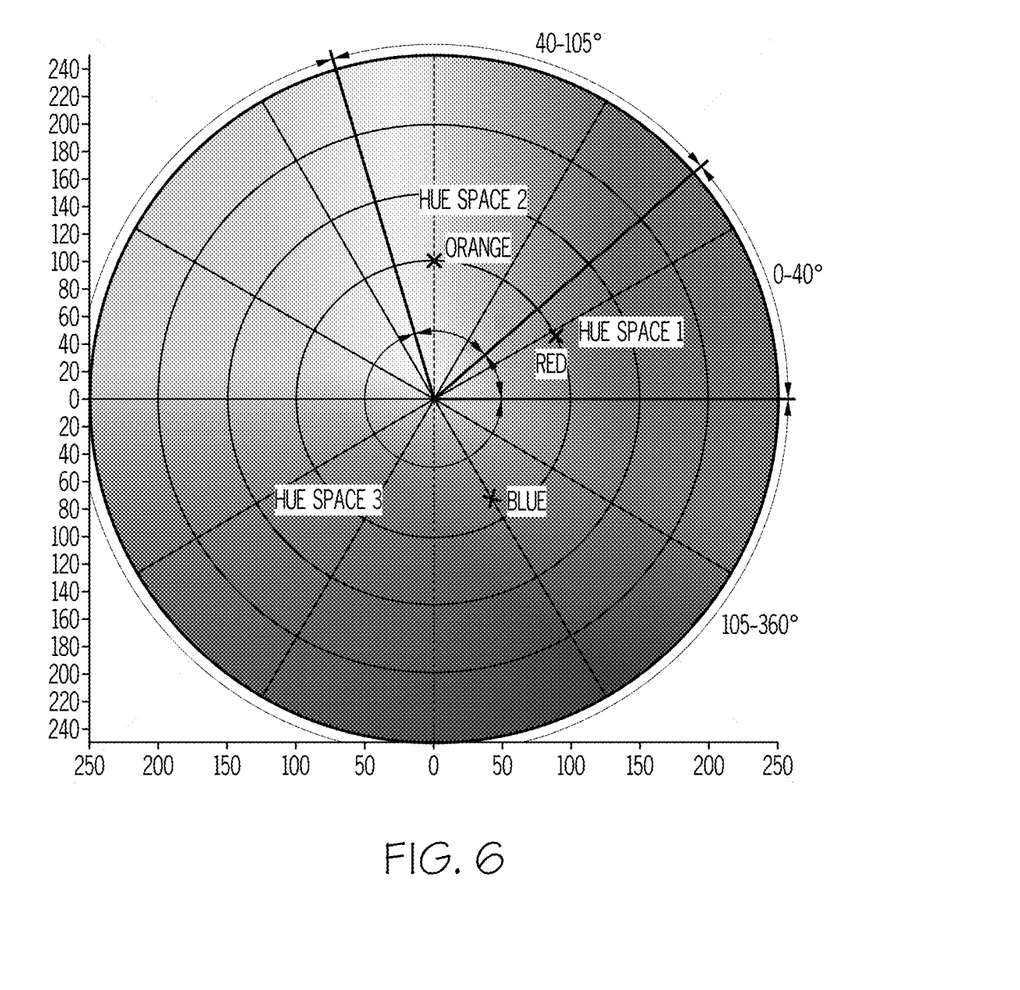
FIG. 6 graphically depicts a CIELAB color space.

Referring now to FIG. 6, a CIELAB color space for characterization of color reflected by the opaque OSC reflecting pigments 150, 190 and the color layer 140 is depicted. The CIELAB color space describes mathematically all perceivable colors in a three dimensional space of $L^*$, $a^*$ and $b^*$. The $a^*$ axis and $b^*$ axis correspond to color components green-red and blue-yellow and the $L^*$ axis corresponds to lightness of a color and extends normal to the $a^*$-$b^*$ plane. Colors in the CIELAB color space are described or quantified with a "hue" and a "chroma", where hue is the angular component and chroma is the radial component of a given color in the CIELAB color space. Particularly, hue is defined as $atan2(b^*, a^*)$ where $atan2(b^*, a^*)$ is the angle in radians between the positive $a^*$-axis and a color with coordinates $(a^*, b^*)$ and chroma is defined as $C^*=\sqrt{(a^*)^2+(b^*)^2}$. The hue angle may be expressed in degrees and is positive for counterclockwise angles, i.e., a hue of 0° lies on the $+a^*$-axis, a hue of 90° lies on the $+b^*$-axis, a hue of 180° lies on the $-a^*$-axis, and a hue of 270° lies on the $-b^*$-axis. For example, the red, orange and blue colors plotted on the CIELAB color space in FIG. 6 (labeled 'red', 'orange', 'blue', respectively) have a hue of about 30° and a chroma $C^*$ of about 90, a hue of about 90° and a chroma $C^*$ of about 100, and a hue of about 300° and a chroma $C^*$ of about 75, respectively.

The CIELAB color space depicted in FIG. 6 is schematically divided into three hue regions or hue spaces that correspond to different multilayer structures of opaque OSC reflecting pigments used to reflect a color within a given hue space. For example, hue space 1 generally corresponds to red colors with a hue between about 0° and about 40°. In some embodiments, opaque OSC reflecting pigments 150 (5-layer pigments) comprising a reflecting layer 152, selective absorber layers 154, 154a and dielectric layers 156, 156a, or a reflecting layer 152, selective absorber layers 154, 154a and absorber layers 156, 156a, are used to reflect a red color within hue space 1. In other embodiments, opaque OSC reflecting pigments 190 (7-layer pigments) comprising a reflecting layer 192, selective absorber layers 194, 194a, absorber layers 196, 196a and dielectric layers 198, 198a are used to reflect a red color within hue space 1. It should be understood that a combination of opaque OSC reflecting pigments 150 and opaque OSC reflecting pigments 190 may be disposed within the color layer 140 to reflect a red color within hue space 1.

Still referring to FIG. 6, hue space 2 generally corresponds to orange and gold colors with a hue between about 40° and about 105°. In some embodiments, opaque OSC reflecting pigments 190 (7-layer pigments) comprising a reflecting layer 192, dielectric layers 194, 194a, absorber layers 196, 196a and dielectric layers 198, 198a are used to reflect orange and gold colors within hue space 2. In other embodiments, opaque OSC reflecting pigments 190 (7-layer pigments) comprising a reflecting layer 192, dielectric layers 194, 194a, absorber layers 196, 196a and selective absorber layers 198, 198a are used to reflect orange and gold colors within hue space 2. It should be understood that a combination of opaque OSC reflecting pigments 190 with dielectric layers 198, 198a and opaque OSC reflecting pigments 190 with selective absorber layers 198, 198a may be disposed within a color layer 140 to reflect orange and gold colors within hue space 2. Hue space 3 generally corresponds to green, blue and violet colors with a hue between about 105° and about 360°. In embodiments, opaque OSC reflecting pigments 190 (7-layer pigments) comprising a reflecting layer 192, dielectric layers 194, 194a, absorber layers 196, 196a and dielectric layers 198, 198a are used to reflect green, blue and violet colors within hue space 3. Also, the omnidirectional properties of the opaque OSC reflecting pigments described herein may be measured by the change (shift) in hue of a given opaque OSC reflecting pigment when viewed at different angles. For example, the opaque OSC reflecting pigments 150, 190 may have a hue shift of less than 30° when viewed at 0° and 45°. In some embodiments, the opaque OSC reflecting pigments 150, 190 may have a hue shift of less than 20° when the opaque OSC reflecting pigments 150, 190 are viewed at 0° and 45°. In other embodiments, the opaque OSC reflecting pigments 150, 190 may have a hue shift of less than 15°, for example, less than 10° when the opaque OSC reflecting pigments 150, 190 are viewed at 0° and 45°.

As mentioned above, the opaque OSC reflecting pigments 150, 190 provide a desired color relative to an adjacent panel that is not a solar panel. Referring to FIGS. 1, 2, and 6, one technique of determining a color difference for a color layer 140 includes measuring and comparing the color of the first portion 147 of the color layer 140 positioned directly above (+Y direction) the photovoltaic cell 130 to the color of the second portion 148 of the color layer that is adjacent to the first portion 147 and not positioned directly above the photovoltaic cell 130. Particularly, the color difference between the first portion 147 and second portion 148 of the color layer 140 can be quantified in CIELAB color space with the expression:

$$\Delta E = \sqrt{(L^*_1 - L^*_2)^2 + (a^*_1 - a^*_2)^2 + (b^*_1 - b^*_2)^2}$$

where the subscript '1' corresponds to the coordinates of the color measured for the first portion 147 in CIELAB color space and the subscript '2' corresponds to the coordinates of the color measured for the second portion 148. A color difference $\Delta E$ between two portions of a color layer 140, e.g., the difference in color between the first portion 147 and the second portion 148, greater than 3.0 corresponds to a color difference that can be noticed by an observer viewing the color layer 140. A color difference $\Delta E$ between two portions of the color layer 140 within the range of about 3.0 and about 0.8 corresponds to a color difference that can be noticed by an observer when the first portion 147 is located directly next to and adjacent the second portion 148 (i.e., a side-by-side visual comparison) but may not be noticed by the observer if the first portion 147 is spaced apart from the second portion 148. A color difference $\Delta E$ between two portions of the color layer less than about 0.8 corresponds to a difference in color that cannot be noticed even when a first portion 147 is located directly next to and adjacent the second portion 148. The color layer 140 may have a color difference less than 5.0, 4.0 3.0, 2.9, 2.8, 2.7, 2.6, 2.5, 2.4, 2.3, 2.2, 2.1, 2.0, 1.9, 1.8, 1.7, 1.6, 1.5, 1.4, 1.3, 1.0, 0.9, 0.8 or 0.7, and greater than 0.5, 0.6, 0.7, 0.8, 0.9, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9 or 3.0 In embodiments, the color layer 140 has a color difference between about 3.0 and about 2.0. In other embodiments, the color layer 140 has a color difference between about 2.0 and about 1.0. In still other embodiments, the color layer 140 has a color difference between about 1.5 and about 0.5, e.g., between about 1.2 and about 0.8. In still yet other embodiments, the color layer 140 has a color difference less than about 0.8.

Figure 7:
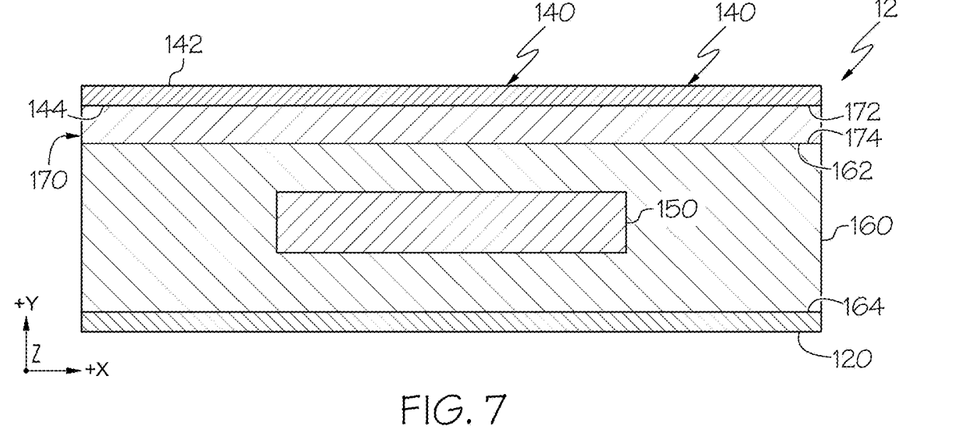
FIG. 7 schematically depicts a cross sectional view of a solar module with a color layer according to one or more embodiments disclosed and described herein.

Referring now to FIG. 7, embodiments of a colored solar module 12 that is similar to the colored solar module 10 depicted in FIG. 1, except for the location of the color layer 140, are depicted. The colored solar module 12 includes the photovoltaic cell 130 disposed within the encapsulant 160 between the light incident side 162 and the backside 164. The back sheet 120 extends across the backside 164 and a color layer 140 extends across the light incident side 162. However, a transparent layer 170 is disposed between the light incident side 162 and the color layer 140. The transparent layer 170 includes a light incident side 172 in contact with the backside 144 of the color layer 140 and a backside 174 in contact with the light incident side 162 of the encapsulant 160. The transparent layer 170 may be formed from transparent glass, or in the alternative, from a transparent resin such as but not limited to ethylene vinyl acetate resin. It should be understood that the transparent layer 170 may provide protection to the encapsulant 160 in the event that the color layer 140 has an opening there through, e.g., chipping of the color layer 140. In the alternative, or in addition to, the transparent layer 170 may be a non-glossy layer (e.g., an anti-reflection coating) that reduces reflection, glare and/or loss of light by reflection. It should also be understood that light T (FIG. 2) that is transmitted through the color layer 140 is also transmitted through the transparent layer 170 and may be incident on the photovoltaic cell 130 as described above with reference to FIG. 2.

Figure 8:
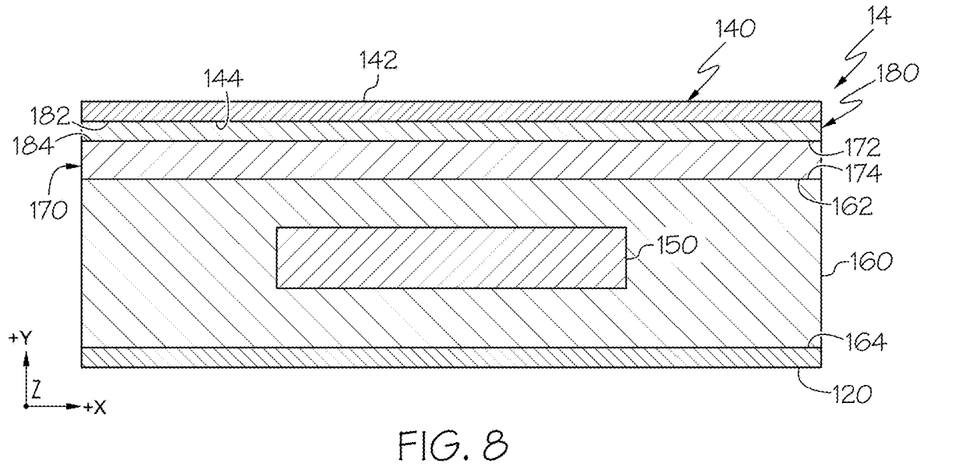
FIG. 8 schematically depicts a cross sectional view of a solar module with a color layer according to one or more embodiments disclosed and described herein.

Referring now to FIG. 8, embodiments of a colored solar module 14 that is similar to the colored solar module 12 depicted in FIG. 7, except for the addition of an adhesive layer, are depicted. Particularly, the colored solar module 14 includes the photovoltaic cell 130 disposed within the encapsulant 160, the transparent layer 170 with the backside 174 in contact with the light incident side 162, and an adhesive layer 180 disposed between the transparent layer 170 and the color layer 140. In embodiments, the adhesive layer 180 may be formed from EVA, PET, polyvinylidene difluoride (PVDF), and the like. The adhesive layer 180 includes a backside 184 in contact with the light incident side 172 of the transparent layer 170 and a light incident side 182 in contact with the backside 144 of the color layer 140. It should be understood that the adhesive layer 180 enhances attachment of the color layer 140 to the transparent layer 170.

Figure 9:
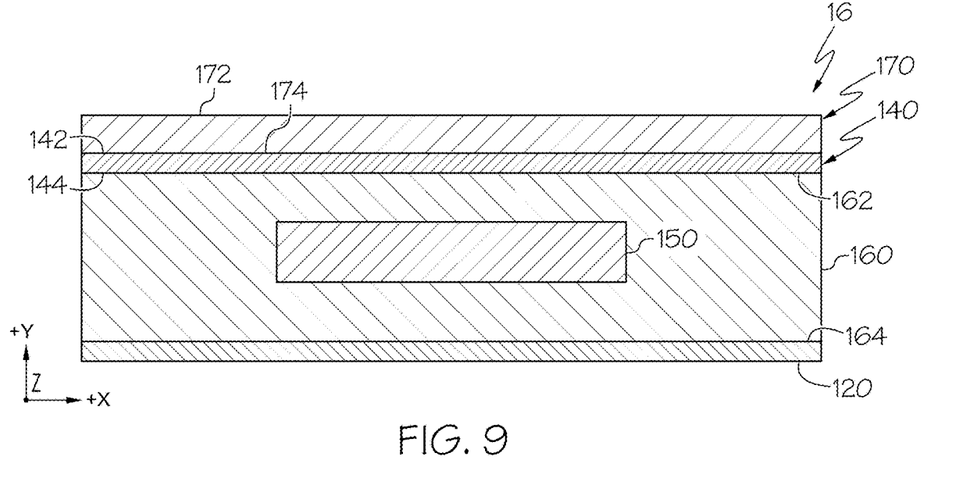
FIG. 9 schematically depicts a cross sectional view of a solar module with a color layer according to one or more embodiments disclosed and described herein.

Referring now to FIG. 9, embodiments of a colored solar module 16 that is similar to the colored solar module 12 depicted in FIG. 7, except for positioning of the color layer 140 and transparent layer 170, are depicted. Particularly, the colored solar module 16 includes the photovoltaic cell 130 disposed within the encapsulant 160, the color layer 140 and the transparent layer 170. However, the colored solar module 16 includes the color layer 140 disposed between the light incident side 162 of the encapsulant 160 and the backside 174 of the transparent layer 170. It should be understood that the transparent layer 170 may be used to protect the color layer 140 in embodiments depicted by the colored solar module 16.

Figure 10:
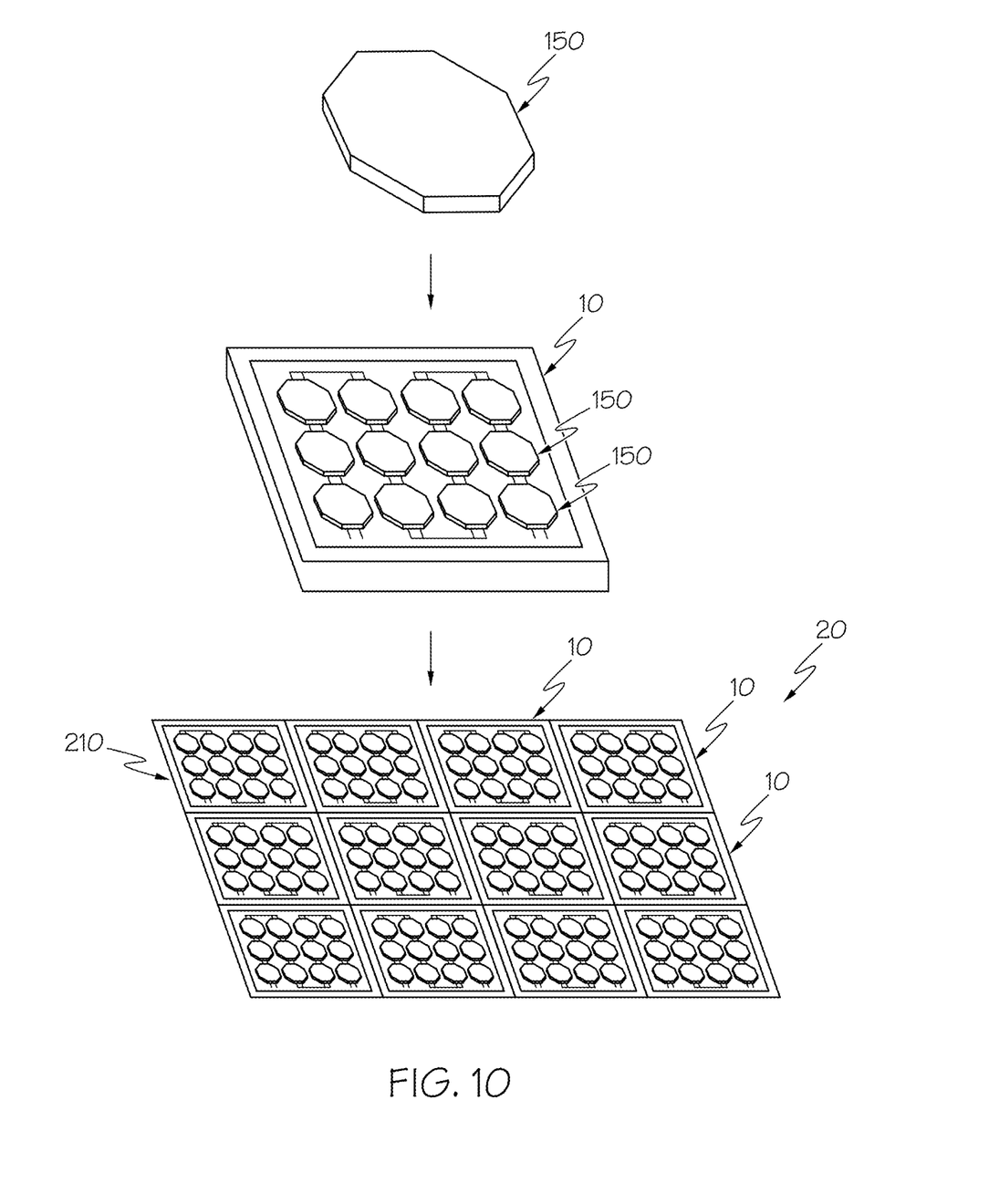
FIG. 10 schematically depicts a solar module formed from a plurality of solar cells according to one or more embodiments disclosed and described herein.

Referring now to FIG. 10, a solar panel assembly 20 formed from a plurality of colored solar modules 10 is depicted. Each colored solar module 10 includes a plurality of photovoltaic cells 130 disposed within an encapsulant 160 (not shown) with a color layer 140 (not shown) extending over the light incident side 162 of the colored solar module 10. Accordingly, the solar panel assembly 20 includes a color layer 140 (not shown) extending over the plurality of photovoltaic cells 130 to provide a desired color for the solar panel assembly 20.

Figure 11:
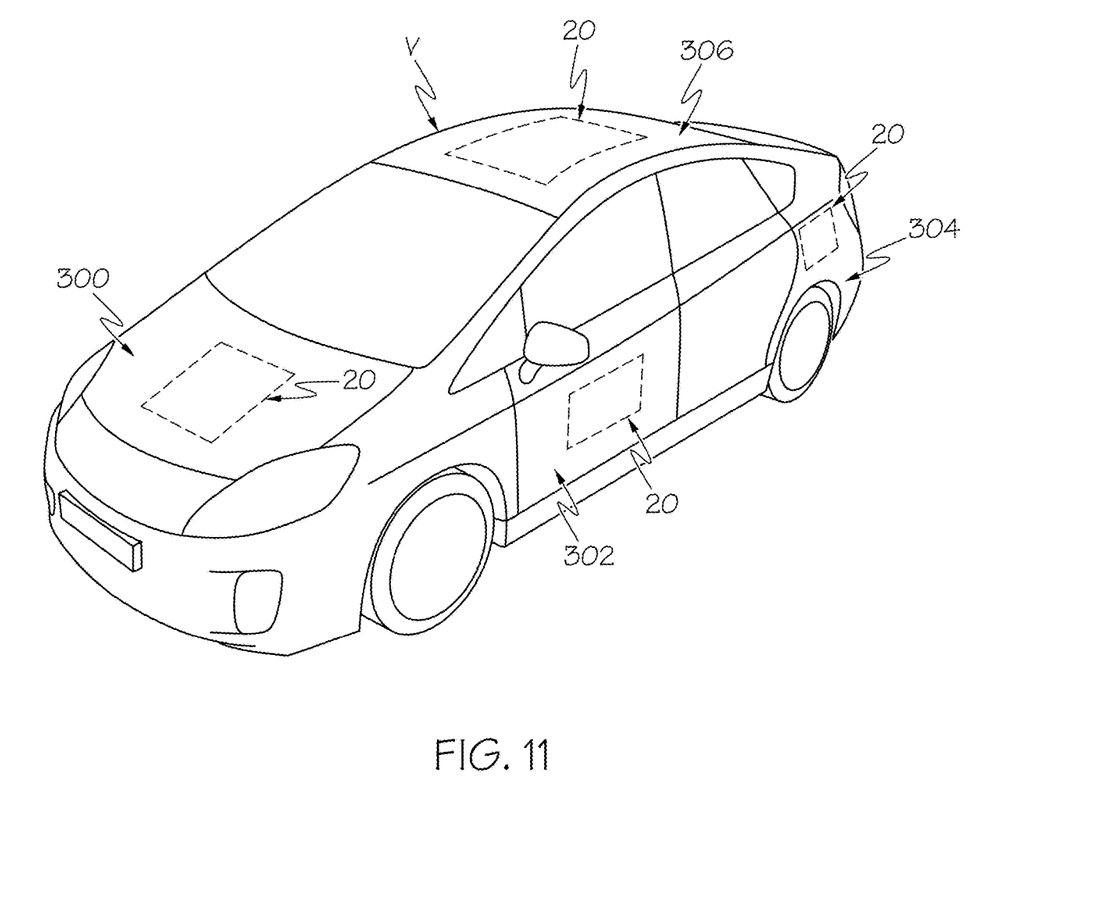
FIG. 11 schematically depicts a vehicle with a body panel including a solar module formed from a plurality of solar cells according to one or more embodiments disclosed and described herein.

Referring now to FIG. 11, a structure with a colored solar panel is depicted. As used herein, the term "structure" refers to architectural structures such as office buildings, homes, industrial buildings, and other structures such as billboards, highway signage, vehicles, and the like. In one embodiment, the structure is a vehicle 'V' with a plurality of body panels that include solar panel assemblies 20 depicted in FIG. 11. In embodiments, the vehicle V includes a hood panel 300, a door panel 302, a rear quarter panel 304 and a roof panel 306. Each of the body panels 300, 302, 304, 306 are formed from a layer of sheet metal, fiberglass, polymer, etc., and include a solar panel assembly 20 as part of the panel. Each of the solar panel assemblies 20 include a plurality of photovoltaic cells 130 (not shown) disposed within an encapsulant 160 (not shown). A color layer 140 (not shown) extends over the light incident side 162 of each colored solar module 10. The color layer 140 includes a plurality of opaque OSC reflecting pigments 150 with a color that matches portions of the body panels 300, 302, 304 that are not formed from the solar panel assemblies 20. That is, a color difference between the color layer 140 on the solar panel assemblies 20 and the body panels 300, 302, 304 not formed from the solar panel assemblies 20 is less than 3.0 as measured in the CIELAB color space. In some embodiments, the color difference between the color layer 140 on the solar panel assemblies 20 and the body panels 300, 302, 304 is between about 3.0 and about 2.0. In other embodiments, the color difference between the color layer 140 on the solar panel assemblies 20 and the body panels 300, 302, 304 is between about 2.0 and about 1.0. In still other embodiments, the color difference between the color layer 140 on the solar panel assemblies 20 and the body panels 300, 302, 304 is between about 1.5 and about 0.5, e.g., between about 1.2 and about 0.8. In still yet other embodiments, the color difference between the color layer 140 on the solar panel assemblies 20 and the body panels 300, 302, 304 is less than about 0.8.

As noted above colored solar modules described herein may be used with other structures such as office buildings, industrial buildings, billboards, highway signage, etc. That is, such structures can include a panel with a desired color and a colored solar module may be positioned or attached adjacent the panel on the structure. The colored solar module has a color that matches the panel with a color difference as measured in the CIELAB color space less than 5.0. Also, the colored solar modules described herein may include designs, writings, etc., on the light incident side of the colored solar modules that can be viewed by an observer. Accordingly, color solar modules described herein may be used as part of advertising messaging, safety messaging, travel information messaging, and the like.

EXAMPLES

Figure 12:
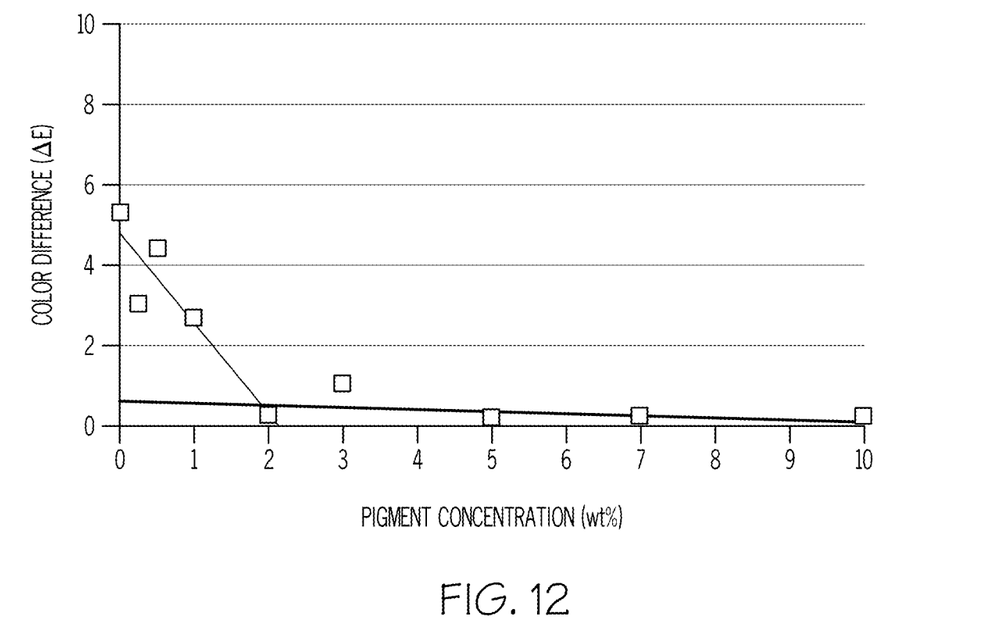
FIG. 12 graphically depicts color difference as a function opaque omnidirectional structural color pigment concentration in a color layer for a solar module with the color layer according to one or more embodiments disclosed and described herein.
Figure 13:
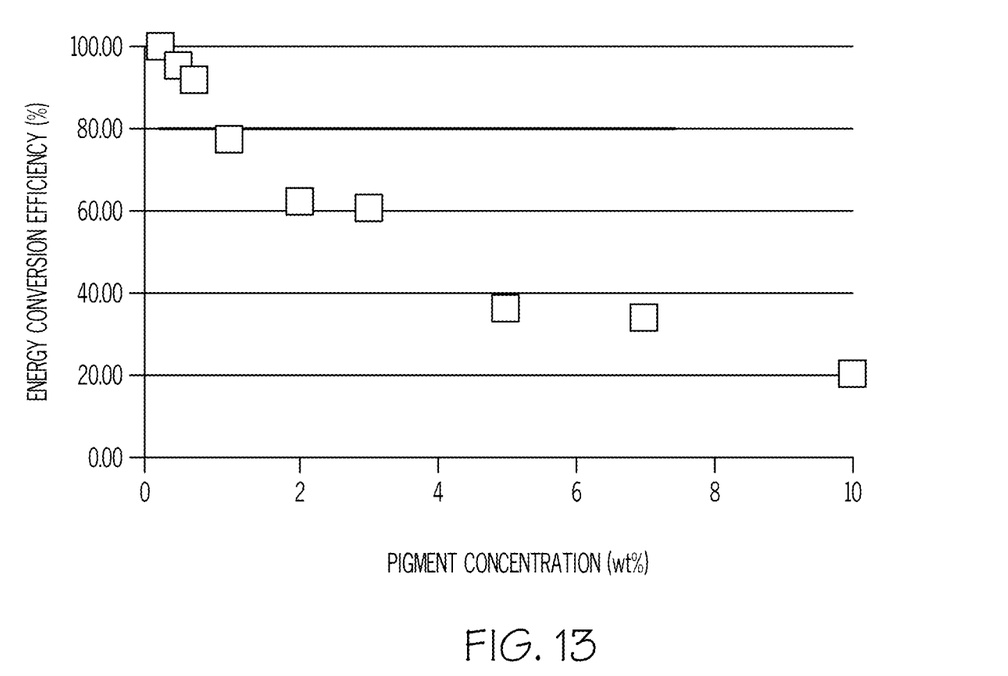
FIG. 13 graphically depicts comparative solar cell efficiency as a function opaque omnidirectional structural color pigment concentration in a color layer for a solar module with the color layer according to one or more embodiments disclosed and described herein.

Referring now to FIGS. 12 and 13, a graphical plot of color difference ΔE as a function of opaque OSC reflecting pigment 190 concentration within a color layer 140 is shown in FIG. 12, and a graphical plot of comparative solar cell efficiency as a function of opaque OSC reflecting pigments 190 concentration within a color layer 140 is shown in FIG. 13. The color difference ΔE values shown in FIG. 12 were determined by measuring the color of the first portion 147 of the color layer 140 (FIG. 1) located directly above (+Y direction) the photovoltaic cell 130 of the colored solar module 10, measuring the color of the second portion 148 of the color layer 140 not located directly over the photovoltaic cell 130, and calculating the color difference ΔE using expression (1) above. The color layer 140 comprised the clear paint layer 146 with a plurality of blue 7-layer opaque OSC reflecting pigments 190 disposed in the clear paint layer 146. The encapsulant 160 was formed from EVA and the back sheet 120 was a black back sheet 120. The colors of the first portion 147 and the second portion 148 were measured with a Konica Minolta CM-512m3A colorimeter. As shown in FIG. 12, a concentration of the opaque OSC reflecting pigments 190 of about 1.0 wt % provides a color difference ΔE of about 3.0 and a concentration of the opaque OSC reflecting pigments 190 equal to or greater than about 1.5 wt % provides a color difference ΔE less than about 0.8. The comparative solar cell efficiency values shown in FIG. 13 were determined by measuring power output from colored solar modules 10 containing different opaque OSC reflecting pigment 190 concentrations disposed in the color layer 140. Power output of a colored solar module 10 without a color layer 140 and a transparent layer 170 in the form of a transparent glass panel extending over and in contact with the light incident side 162 of the colored solar module 10 was taken as a reference solar cell efficiency, i.e., a comparative solar cell efficiency of 100%. As shown in FIG. 13, the concentration of the opaque OSC reflecting pigments 190 of about 1.2 wt % provides a comparative solar cell efficiency equal to or greater than 70%, for example about 78%.

The colored solar modules described herein may be used as part of an office building, industrial building, highway signage, billboard, vehicle body panels, etc., to convert solar radiation into electrical energy. The terms solar modules and solar panels may interchangeably refer to a solar energy device with a photovoltaic cell that converts solar radiation into electrical energy. Although the embodiments disclosed and described in the figures depict colored solar modules for use with vehicle body panels, the colored solar modules be used with other types of panels including but not limited to architectural panels formed from glass, sheet metal, concrete, and the like, to convert solar radiation into electrical energy. For example and without limitation, colored solar panels may be used as part of the building exterior to provide an aesthetically pleasing surface for the building and have a color that matches surrounding surfaces of the building exterior.

Directional terms as used herein—for example up, down, right, left, front, back, top, bottom, vertical, horizontal—are made only with reference to the figures as drawn and are not intended to imply absolute orientation unless otherwise expressly stated. The terms "generally," "approximately," and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. In general, any quantitative comparison, value, measurement, or other representation is "about" or "approximate" whether or not expressly stated to be such.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A colored solar module comprising:
  a solar module comprising a light incident side, a backside and a photovoltaic cell positioned between the light incident side and the backside;
  a color layer extending across the light incident side of the solar module, the color layer comprising a clear paint layer and a plurality of opaque reflecting pigments disposed in the clear paint layer, wherein:
    a concentration of the plurality of opaque reflecting pigments in the color layer is between about 0.1 wt % and about 15.0 wt %;
    a comparative solar cell efficiency of the solar module is equal to or greater than 70%; and
    a color difference between a combination of the color layer and a portion of the solar module including the photovoltaic cell beneath the color layer and a combination of the color layer and a portion of the solar module not including the photovoltaic cell beneath the color layer is less than about 3.0 as measured in CIELAB color space.

2. The colored solar module of claim 1, wherein the concentration of the plurality of opaque reflecting pigments in the color layer is between about 1.0 wt % and about 2.0 wt %.

3. The colored solar module of claim 1, wherein the plurality of opaque reflecting pigments reflect a color with a chroma equal to or greater than 30 as measured in CIELAB color space.

4. The colored solar module of claim 1, wherein the plurality of opaque reflecting pigments reflect a color with a chroma equal to or greater than 50 as measured in CIELAB color space.

5. The colored solar module of claim 1, wherein the photovoltaic cell is disposed within an encapsulant.

6. The colored solar module of claim 5, wherein the color layer is in direct contact with the light incident side of the encapsulant.

7. The colored solar module of claim 6, further comprising a transparent layer extending across a light incident side of the color layer.

8. The colored solar module of claim 7, wherein the transparent layer is formed from a transparent glass or a transparent resin.

9. The colored solar module of claim 1, further comprising a transparent layer disposed between the light incident side and the color layer.

10. The colored solar module of claim 1, wherein the plurality of opaque reflecting pigments comprise a plurality of opaque omnidirectional structural color reflecting pigments.

11. A colored solar module comprising:
  an encapsulant, a light incident side, a backside, and a plurality of photovoltaic cells disposed within the encapsulant between the light incident side and the backside;
  a color layer extending across the light incident side and over the plurality of photovoltaic cells, the color layer comprising a clear paint layer and a plurality of opaque omnidirectional structural color reflecting pigments disposed in the clear paint layer, wherein:
    a concentration of the plurality of opaque reflecting pigments throughout the color layer is between about 0.25 wt % and about 5.0 wt %;
    the plurality of opaque reflecting pigments reflect a color with a chroma equal to or greater than 60 as measured in CIELAB color space; and
    a comparative solar cell efficiency of the colored solar module is equal to or greater than 70%.

12. The colored solar module of claim 11, wherein the chroma is equal to or greater than 70 as measured in CIELAB color space.

13. The colored solar module of claim 11, wherein a color difference between a combination of the color layer and a portion of the solar module including a photovoltaic cell beneath the color layer and combination of the color layer and a portion of the solar module not including a photovoltaic cell beneath the color layer as measured in CIELAB color space is less than about 5.0.

14. The colored solar module of claim 13, wherein the color difference between the combination of the color layer and the portion of the solar module including a photovoltaic cell beneath the color layer and combination of the color layer and the portion of the solar module not including a photovoltaic cell beneath the color layer is less than about 3.0.

15. The colored solar module of claim 11, further comprising a transparent layer extending across an outer surface of the color layer.

16. The colored solar module of claim 11, further comprising a transparent layer disposed between the light incident side of the encapsulant and the color layer.

17. A structure with a colored solar module, the structure comprising:
  a panel;
  a colored solar module positioned adjacent to the panel, the colored solar module comprising a photovoltaic cell disposed within an encapsulant between a light incident side and a backside of the encapsulant;
  a color layer extending across the light incident side of the encapsulant and over the photovoltaic cell, the color layer comprising a clear paint layer and a plurality of opaque reflecting pigments disposed in the clear paint layer, wherein:
    a concentration of the plurality of opaque reflecting pigments throughout the color layer is between about 0.25 wt % and about 5.0 wt %;
    the plurality of opaque reflecting pigments reflect a color with a chroma greater than 60 as measured in CIELAB color space;
    a color difference between the panel and the colored solar module as measured in CIELAB color space is less than about 5.0;
    a comparative solar cell efficiency of the colored solar module is equal to or greater than 70%.

18. The structure of claim 17, wherein the color difference between the panel and the colored solar module is less than about 3.0.

* * * * *

UNITED STATES PATENT AND TRADEMARK OFFICE
CERTIFICATE OF CORRECTION

PATENT NO. : 11,011,657 B2
APPLICATION NO. : 15/730035
DATED : May 18, 2021
INVENTOR(S) : Debasish Banerjee, Yuki Kudo and Taizo Masuda Page 1 of 1

It is certified that error appears in the above-identified patent and that said Letters Patent is hereby corrected as shown below:

On the Title Page

Item (71), applicant 2, city, delete "Toyota" and insert --Toyota-shi Aichi-ken--, therefor.

Item (72), inventor 2, city, delete "Shizoka" and insert --Susono, Shizoka--, therefor.

Item (72), inventor 3, city, delete "Kanagawa" and insert --Yokohama, Kanagawa--, therefor.

Item (73), assignee 2, city, delete "Toyota" and insert --Toyota-shi Aichi-ken--, therefor.

Item (74), attorney, agent, or firm, delete "Dinsmore & Shohl" and insert --Dinsmore & Shohl LLP--, therefor.

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*